United States Patent
Arai et al.

(10) Patent No.: US 8,796,594 B2
(45) Date of Patent: Aug. 5, 2014

(54) SEMICONDUCTOR MANUFACTURING EQUIPMENT AND HEATER STRUCTURAL CONNECTION

(75) Inventors: Hideki Arai, Numazu (JP); Satoshi Inada, Fukushima-ken (JP); Yoshikazu Moriyama, Izu (JP); Noriki Juumatsu, Mishima (JP)

(73) Assignee: NuFlare Technology, Inc., Shizuoka-ken (JP)

( * ) Notice: Subject to any disclaimer, the term of this patent is extended or adjusted under 35 U.S.C. 154(b) by 1439 days.

(21) Appl. No.: 11/723,028

(22) Filed: Mar. 16, 2007

(65) Prior Publication Data

US 2007/0221657 A1   Sep. 27, 2007

(30) Foreign Application Priority Data

Mar. 24, 2006   (JP) ................. P2006-083517

(51) Int. Cl.
*H05B 1/02* (2006.01)
*H01L 21/67* (2006.01)

(52) U.S. Cl.
CPC ............... *H01L 21/67103* (2013.01)
USPC .......................................... 219/501; 219/390

(58) Field of Classification Search
USPC ........ 219/444.1, 539–542, 546–548; 118/725
See application file for complete search history.

(56) References Cited

U.S. PATENT DOCUMENTS

| | | | |
|---|---|---|---|
| 4,872,835 A * | 10/1989 | Tullis et al. | 432/225 |
| 5,025,133 A | 6/1991 | Tsutahara et al. | |
| 5,344,492 A * | 9/1994 | Sato et al. | 118/725 |
| 5,759,281 A * | 6/1998 | Gurary et al. | 118/725 |
| 5,850,071 A | 12/1998 | Makiguchi et al. | |
| 5,859,408 A | 1/1999 | Baxendine | |
| 6,744,018 B2 | 6/2004 | Takano | |
| 6,753,507 B2 * | 6/2004 | Fure et al. | 219/444.1 |
| 7,393,417 B1 | 7/2008 | Maeda et al. | |
| 2004/0238520 A1 | 12/2004 | Kuibira et al. | |
| 2005/0045618 A1 | 3/2005 | Ito | |
| 2006/0130763 A1* | 6/2006 | Emerson et al. | 118/725 |

FOREIGN PATENT DOCUMENTS

| | | |
|---|---|---|
| JP | 3-80530 | 4/1991 |
| JP | 10-208855 | 8/1998 |
| TW | 460922 | 10/2001 |
| TW | 569643 | 1/2004 |
| TW | I248135 | 1/2006 |

OTHER PUBLICATIONS

Taiwan IPO Search Report issued by the Taiwanese Intellectual Property Office on Sep. 17, 2009, for Taiwanese Patent Application No. 095146711.

* cited by examiner

*Primary Examiner* — Brian Jennison
(74) *Attorney, Agent, or Firm* — Finnegan, Henderson, Farabow, Garrett & Dunner, L.L.P.

(57) ABSTRACT

A semiconductor manufacturing equipment is provided herein. The semiconductor manufacturing equipment includes a heater element configured to heat a wafer, a first connection part and a second connection part integrated with the heater element, a first electrode electrically contacted with and fixed to the first connection part on a first surface of the first electrode, and a second electrode electrically contacted with and fixed to the second connection part on a second surface of the second electrode. The second surface is perpendicular to the direction of the first surface, and the heater element produces heat by applying a voltage between the first electrode and the second electrode.

6 Claims, 5 Drawing Sheets

SEMICONDUCTOR MANUFACTURING EQUIPMENT AND HEATER STRUCTURAL CONNECTION

CROSS-REFERENCE TO RELATED APPLICATIONS

This application is based upon and claims the benefit of priority from the prior Japanese Patent Application No. 2006-83517 filed on Mar. 24, 2006, the entire contents of which are incorporated herein by reference.

BACKGROUND OF THE INVENTION

1. Field of the Invention

The present invention relates to a heater to heat, from a rear surface in forming a film onto, for example, a semiconductor wafer, and relates to semiconductor manufacturing equipment.

2. Description of the Related Art

In recent years, with miniaturizing semiconductor manufacturing equipment, high film-forming uniformity in its manufacturing process has been required. A rear surface heating system used for chemical vapor deposition (CVD) device such as an epitaxial growth device, having no heating source above a wafer, and enabling a reaction gas to flow in a vertical direction, can form a uniform film.

In such a rear surface heating system, a resistance heating heater being used as the heating source, the heater must be stable in high temperature (above 1300° C. at a heater temperature), and also must be highly-pure (heating with fewer pollutants). Therefore, for instance, a SiC material etc. is used as a heater element material in order to be stable and not to cause low metal-staining in high temperatures.

A heater element like this, as described in [0019] and FIG. 10 of Jpn. Pat. Appln. Publication No. 10-208855, is fixed to a heater support body 18 with bolts. However, it presents problems such that a connection surface at a fixed position adjacent to the heater element to be heated in high temperatures cause surface roughness due to variations in heat or gas and increases connection resistance.

For instance, if there are deviations in the height and position of the heater support body 18, and in the dimensions of a heater, using a hard material with low flexibility, such as a SiC material, poses the problems that it is difficult to correct the deviations, and it is impossible to surely fix the heater. In addition, failures are generated, such as a bad electrical contact between heater and electrode, heating and thermal degradation due to electric field concentration at a connection part, or damage of a heater caused by thermal stresses.

SUMMARY OF THE INVENTION

An object of the present invention is to provide semiconductor manufacturing equipment capable of connecting a heater for heating a rear surface to an electrode certainly at an optimum position, and to provide a heater.

Semiconductor manufacturing equipment according to an aspect of the invention includes a heater element configured to heat a wafer, a first connection part and a second connection part which are integrated with the heater element, configured to apply voltages to the heater element, a first electrode contacted with and fixed to the first connection part on a first surface of the first electrode configured to be to apply a voltage to the first connection part, a second electrode which is contacted with and fixed to the second connection part on a second surface of the second electrode, configured to apply a voltage to the second connection part, and the second surface is perpendicular to the direction of the first surface.

Further, Semiconductor manufacturing equipment according to an aspect of the invention includes a heater element configured to heat a wafer, a first connection part and a second connection part configured to apply voltages to the heater element, both of the connection parts integrated with the heater element, a first electrode contacted with and fixed to the first connection part on a first surface of the first electrode configured to be to apply a voltage to the first connection part, a second electrode contacted with and fixed to the second connection part on a second surface of the second electrode configured to apply a voltage to the second connection part, openings prepared in the first and the second connection parts, and the first and the second electrodes, respectively, a first bolt configured to fix the first connection part and the first electrode by passing though the opening of the first connection part, the first bolt having smaller diameter than the opening of the first connection part, and a second bolt which has smaller diameter than the opening of the second connection part, configured to fix the second connection part and the second electrode by passing through the opening of the second connection part.

Further, A heater according to an aspect of the invention includes a heater element configured to heat a wafer from a rear surface, a first connection part which is integrated with the heater element, configured to apply voltages to the heater element, a second connection part which is integrated with the heater element, configured to apply voltages to the heater element, and the second surface is perpendicular to the direction of the first surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE EMBODIMENTS

Embodiments of the present invention will be described with reference to the drawings hereinafter.

First Embodiment

Figure 1:
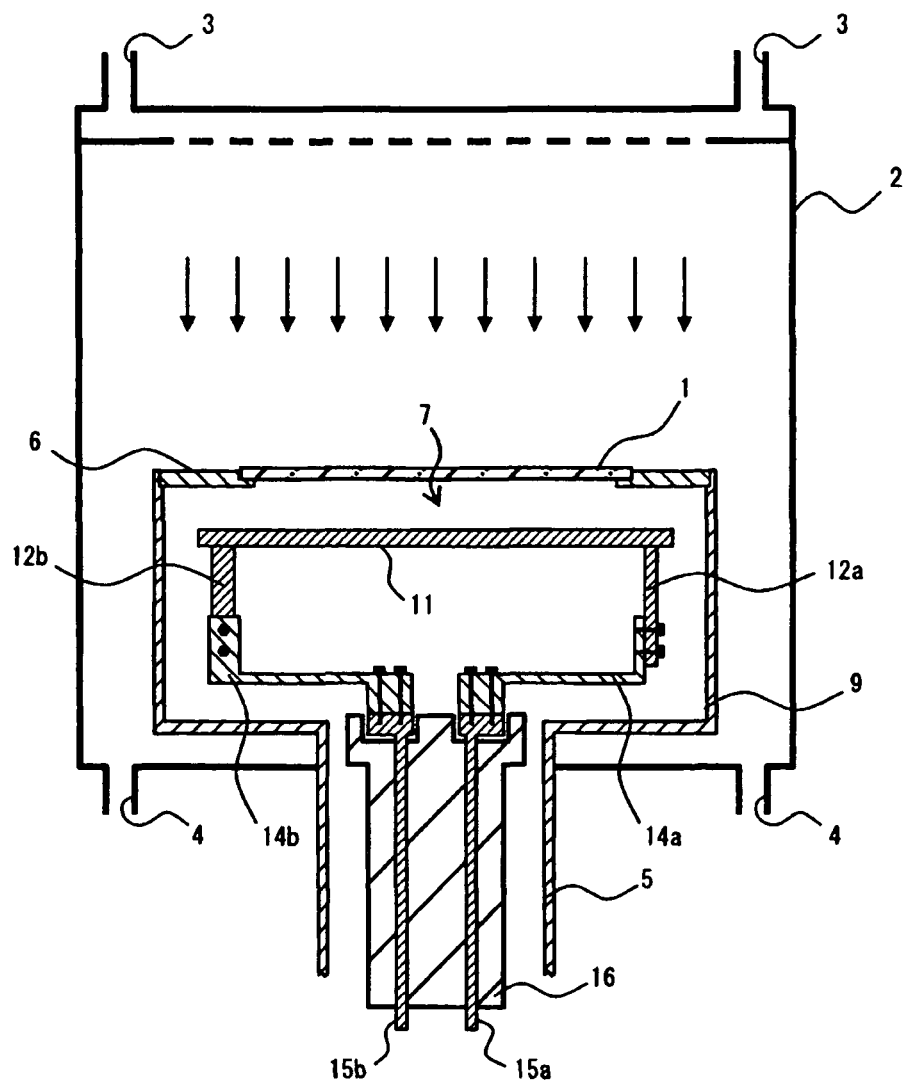
FIG. 1 is a cross-section view showing the semiconductor manufacturing equipment relating to the first embodiment of the present invention.

FIG. 1 depicts a cross-section view of semiconductor manufacturing equipment of the first embodiment. A reaction chamber 2 to which a wafer 1 is guided, as shown in FIG. 1, is provided with a gas supply port 3 to supply a reaction gas consisting of a film-forming gas and a carrier gas from above the reaction chamber 2, and with a gas discharge port 4 to discharge the reaction gas from below the reaction chamber 2. A rotational driving means 5 to rotate the wafer 1 and a ring-shaped (or "annular-shaped") holder 6 to hold the wafer at its outer circumference portion on the driving means 5 are disposed in the reaction chamber 2. Further, an in-heater 7 is installed therein to heat the wafer 1 from below.

Figure 2:
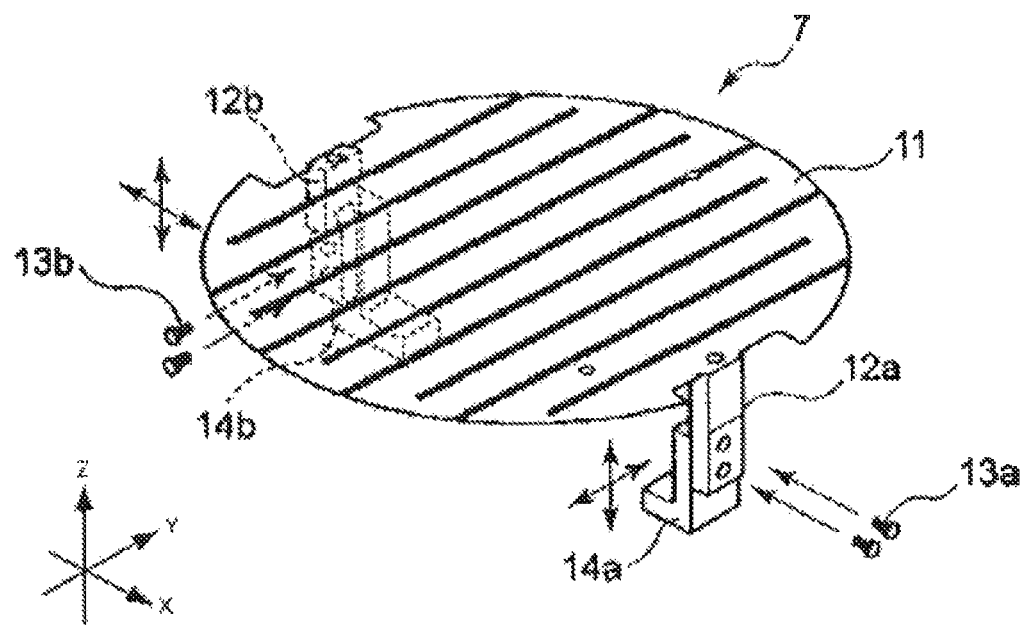
FIG. 2 is a perspective view showing the heater relating to an embodiment of the present invention.
Figure 3:
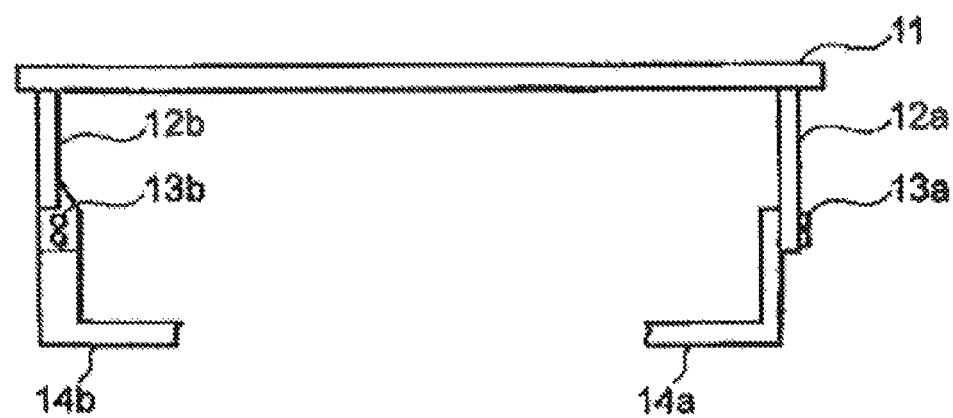
FIG. 3 is a side view showing the heater shown in FIG. 2.
Figure 4:
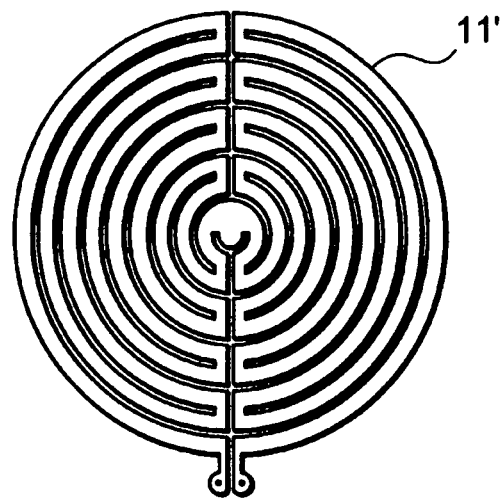
FIG. 4 is a drawing showing another pattern of a heater element relating to an embodiment of the present invention.

FIG. 2 depicts a perspective view of the in-heater 7, and FIG. 3 depicts its side view. As shown in the views, the in-heater 7 is integrally structured with welding, etc., of a resistance-heating-type heater element 11 composed of, for instance, a SiC based material, and of a pair of connection parts 12a and 12b. With regard to the pattern of the heater element 11, an example is shown in Figures, any type of the pattern can be used if uniformly heating to a semiconductor substrate and corresponding to a change in temperature are possible. As for another pattern, for example, a heater element 11' with a pattern shown in FIG. 4 is available.

The connection parts 12a and 12b are fixed with bolts 13a and 13b composed of the SiC based material, etc., so as to come into surface contact with electrodes (booth bars) 14a and 14b. At this moment, a contact surface between the lower part of the connection parts 12a and the electrode 14a, and a contact surface between the lower part of the connection part 12b and the electrode 14b are different in surface direction by 90°. The electrodes 14a and 14b are fixed to electrode rods 15a and 15b with bolts, respectively, and connected, through the electrode rods 15a and 15b, to a temperature control mechanism (not shown) to electrically control temperatures. A heater shaft 16 (FIG. 1) holds the electrode rods 15a and 15b, and the upper part of the heater shaft 16 and the head sections of the electrodes rods 15a and 15b make play therebetween.

Figure 5:
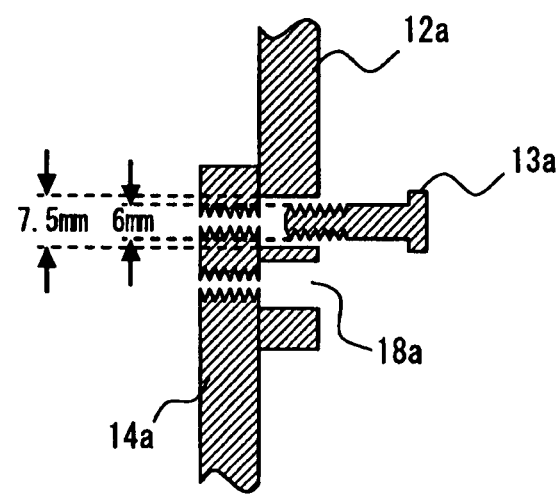
FIG. 5 is a drawing showing a connection part and a connecting portion of an electrode relating to an embodiment of the present invention.

FIG. 5 shows the connecting section of the connection part 12a and the electrode 14a. As shown in FIG. 5, the connection part 12a has an opening 18a. The diameter of the opening 18a is set to, for example, 7.5 mm in comparison to the standardized diameter 6 mm of the bolt 13a. That is, a tolerance of ±0.75 mm is allowed, and in the range, the fixed position of the connection part 12a and the electrode 14a can be moved in a contact surface direction. Therefore, if the dimension tolerance of the heater element is within ±0.2 mm, and the attachment dimension tolerance of the electrode is within ±0.5 mm, the fixed position falls with in a movable range. Similarly, in the connection part 12b and the electrode 14b, with the similar tolerances are allowed, the fixed position being movable in its contact surface direction, any deviation in an in-plane direction and a height direction of the heater element 11 can be corrected if the fixed position is within the movable range.

Figure 6:
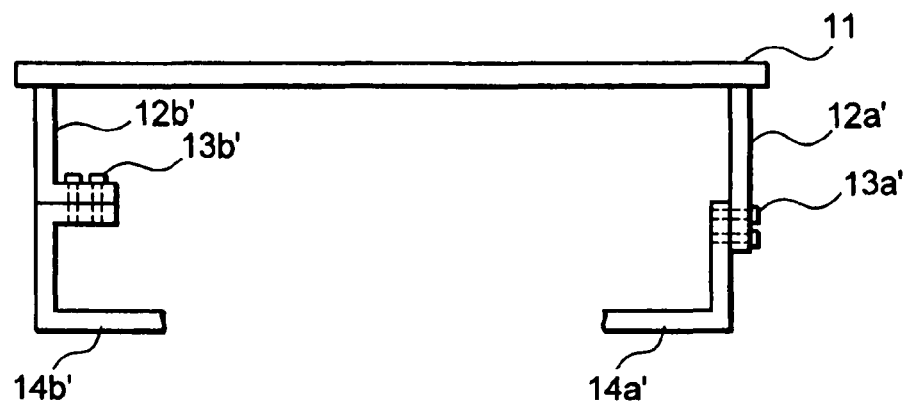
FIG. 6 is a drawing showing connection parts and connecting portions of the electrodes relating to an embodiment of the present invention.

In terms of the positional relationship between the connection part and the electrode, it is enough for the movable range in both directions of the in-plane direction and the height direction of the heater element, and it is not limited to the present embodiment. For instance, as shown in FIG. 6, between a connection part 12a' and an electrode 14a' and between a connection part 12b' and an electrode 14b' may be fixed with a bolt 13a' and 13b', respectively.

Like this manner, fixing between the connection part and the electrode at a position away from the heater element by a certain distance makes it possible to restrain a change resulted from heat and gas at the connection part caused by an increase in temperature at the contact surface. By fixing each connection part and each electrode of the heater in addition to the correction of the deviations, secure connection is achieved, and a failure, such as a defective connection between the connection part of the heater and the electrode or damage of the heater, can be suppressed. Fine adjustment of the heater position in a vertical direction becoming possible, optimizing the positions makes an improvement of uniformity of film thickness of formed coating. Further, providing play on a heater shaft side holding the electrode rods enables responding to the positional variations of the electrodes resulted from such a structure.

Second Embodiment

Figure 7:
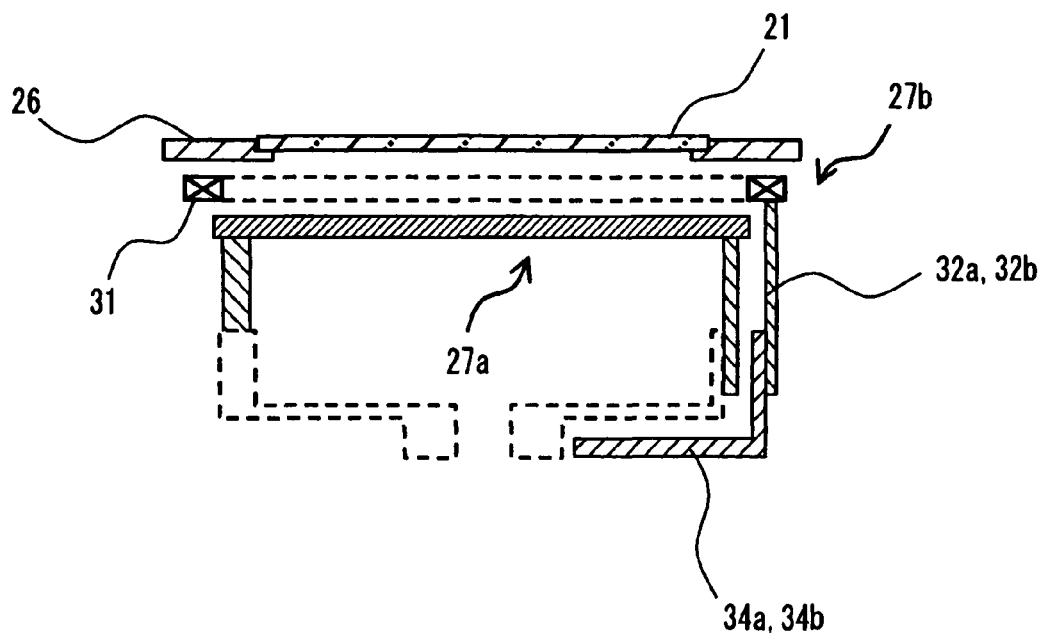
FIG. 7 is a cross-section view showing the semiconductor manufacturing equipment relating to another embodiment of the present invention.

FIG. 7 illustrates a partial cross-section view of semiconductor manufacturing equipment of the present embodiment. The embodiment differs, from the first embodiment, in having, in addition to an in-heater 27a, an out-heater 27b to heat a ring-shaped holder 26.

Figure 8:
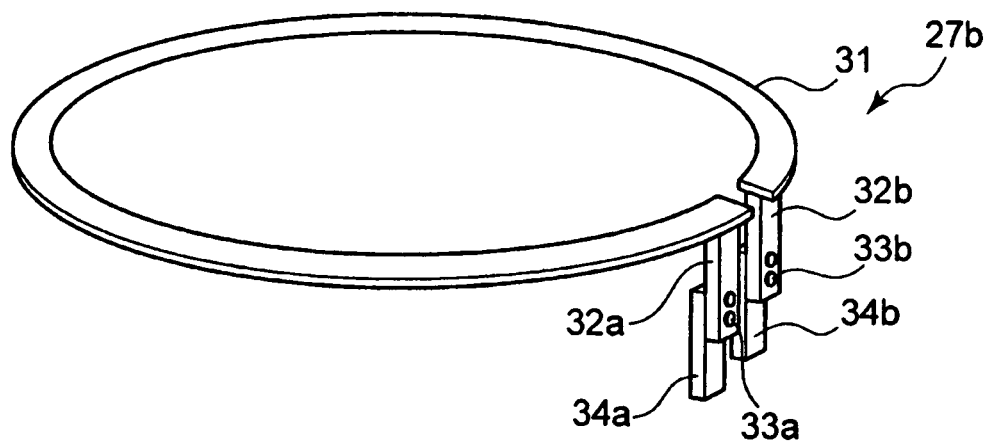
FIG. 8 is a perspective view showing the heater relating to another embodiment of the present invention.
Figure 9:
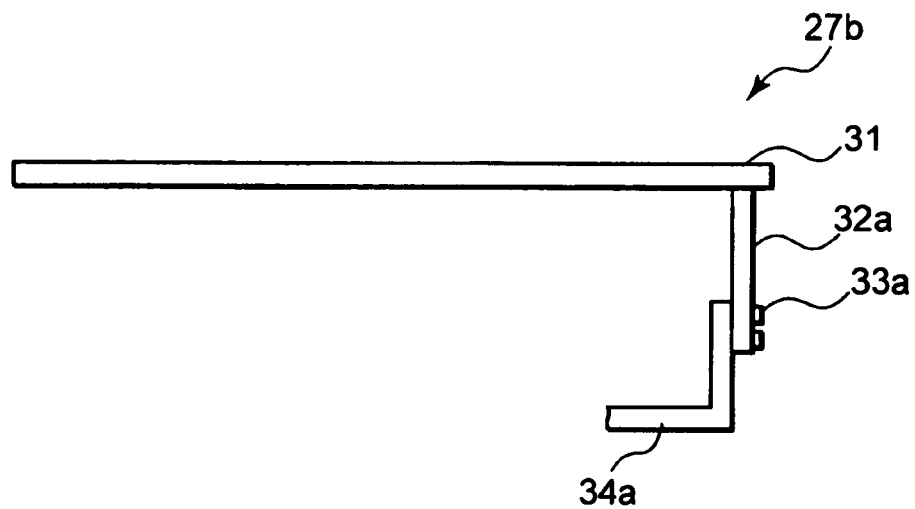
FIG. 9 is a side view showing the heater shown in FIG. 8.

FIG. 8 depicts a perspective view of the out-heater 27b, and FIG. 9 depicts its side view. As shown in Figures, in a like manner in the first embodiment, the out-heater 27b is integrally structured with welding, etc., of a resistance-heating-type heater element 31 made of, for instance, a SiC based material, and of a pair of connection parts 32a and 12b.

Connection parts 32a and 32b are fixed so as to come into surface contact with electrodes 34a and 34b with bolts 33a and 33b made of the SiC based material. The electrodes 34a and 34b, in a similar way in the first embodiment, are connected to a temperature control mechanism (not shown) to electrically control temperatures through electrode rods (not shown) held to heater shafts (not shown), respectively.

Like the first embodiment, the connection parts 32a and 32b each has openings. The diameter of each opening is set to, for example, 7.5 mm, and in comparison to the standardized diameter 6 mm of each bolt 33a and 33b, tolerances are allowed in a similar manner in the first embodiment. Therefore, the fixed position between the connection part 32a and the electrode 34a can be moved in a contact surface direction.

In the second embodiment, the out-heater is shaped in a ring; its electrodes are formed on the same plane. Therefore, the contact surface at which the lower part of the connection part 32a is contacted with the electrode 34a is substantially same as the contact surface at which the lower part of the connection part 32b is contacted with the electrode 34b in the surface direction. Because the variations of the electrode positions due to heater, etc., are restrained almost only in the surface direction. However, to adjust the dimension difference, etc., in the surface direction and the vertical direction, like the first embodiment, the surface direction may be different by 90°. It is not always necessary for the electrodes to be formed on the same plane, as similar way in the first embodiment; they may be formed to face each other. In such a case, like the first embodiment, it is needed for both directions to be different by 90°.

According to this manner, fixing the connection parts and the electrodes at the positions away from the heater element by certain distances enables suppressing changes due to heat and gas at the connection parts caused from the increase in temperature at the contact surfaces. In addition to the correction of the deviations, by fixing between each connection part and each electrode of the heater, as is the case of the first embodiment, the second example can obtain assure connection and suppress a failure such as a connection fault and damage. Becoming possible to finely adjust the heater position in the vertical direction, by optimizing the position, it becomes possible, in the similar manner in the first embodiment, to improve the film thickness uniformity of the coating to be formed. Further, just like the first embodiment, providing the play on the heater shaft side holding the electrode rods enables responding to the variations of the positions of the electrodes resulted from such a structure.

Using the SiC based material for a heater element material, so long as a material which does not cause low-temperature pollution at high temperatures and is stable, the material is not specially limited, and using, for example, a carbon material, a material in which SiC coating is performed onto the carbon material or a SiC material, and a high-melting point metal material such as Ir is available. For the bolt, the SiC material like the heater element material being used, the material similar to the heater element material or the electrode material is preferable.

The opening diameter of the connection part having set to 7.5 mm compared with the bolt diameter 6 mm, and the tolerance having set to ±0.75 mm, the tolerance can be appropriately set in response to the bolt diameter. It is preferable for the opening diameter to be set to 10-20% of the bolt diameter. If the tolerance is too large, the stability of the connection cannot be secured. On the contrary, if the tolerance is too small, the deviation due to the tolerance of the dimension and the position cannot be corrected.

These embodiments make it possible for the heater for the rear surface heating of the semiconductor substrate to surely connect to the electrode at the optimum position. Accordingly, these embodiments can make the coating forming process onto the semiconductor substrate, and can uniform the thickness of the film formed on the semiconductor substrate. In the wafer formed by this semiconductor manufacturing equipment, and the semiconductor device formed through an element forming process and an element isolating process, it becomes possible to stabilize yield and an electron property. Especially, these embodiments are effective for applying to a thick film forming process of a power semiconductor device such as a Power MOSFET and an IGBT (insulated gate bipolar transistor) in which thick films on the order of several 10 µm through 100 µm are used for an N-type base region, P-type base region, insulating isolation region, etc.

Additional advantages and modifications will readily occur to those skilled in the art. Therefore, the invention in its broader aspects is not limited to specific details and representative embodiments shown and described herein. Accordingly, various modifications may be made without departing from the spirit or scope of the general inventive concept as defined by the appended claims and their equivalents.

What is claimed is:

1. A semiconductor manufacturing equipment comprising:
    a heater including a heater element part, a first connection part and a second connection part,
    wherein the heater element part is configured to heat a wafer from a rear surface of the wafer, and the first connection part and the second connection part are integrated with the heater element part, and are projected from a rear surface of the heater element part;
    a first electrode contacted with and fixed to the first connection part, and configured to apply a voltage to the first connection part, wherein a first contact surface between the first electrode and the first connection part is perpendicular to the rear surface of the heater element part; and
    a second electrode contacted with and fixed to the second connection part, and configured to apply a voltage to the second connection part, wherein a second contact surface between the second electrode and the second connection part is respectively perpendicular to the rear surface of the heater element part and the first contact surface
    wherein the first connection part and the first electrode are movable in the first contact surface; and
    the second connection part and the second electrode are movable in the second contact surface.

2. The semiconductor manufacturing equipment according to claim 1, wherein the heater element part is made of material selected from the group consisting of a carbon material, a SiC material, a carbon material coated with SiC, a SiC material coated with SiC, and a high melting-point metal material.

3. The semiconductor manufacturing equipment according to claim 1, further comprising:
    a first electrode rod configured to fix the first electrode;
    a second electrode rod configured to fix the second electrode;
    a heater shaft configured to hold the first and the second electrodes; and
    play between an upper part of the heater shaft and each head part of the first and the second electrode rods.

4. A heater structural connection that produces heat by applying a voltage between a first electrode and a second electrode, the heater structural connection comprising:
    a heater including a heater element part, a first connection part, and a second connection part,
    wherein the heater element part is configured to heat a wafer from a rear surface of the wafer;
    the first connection part configured to be connected with and fixed to the first electrode, the first connection part being integrated with the heater element part and being projected from a rear surface of the heater element part, wherein a first contact surface between the first electrode and the first connection part is perpendicular to the rear surface of the heater element part; and
    the second connection part configured to be connected with and fixed to the second electrode, the second connection part integrated with the heater element part and being projected from the rear surface of the heater element part, wherein a second contact surface between the second electrode and the second connection part is respectively perpendicular to the rear surface of the heater element part and the first contact surface;
    wherein the first connection part and the first electrode are movable in the first contact surface; and
    the second connection part and the second electrode are movable in the second contact surface.

5. The heater structural connection according to claim 4, wherein the heater element part is made of material selected from the group consisting of a carbon material, a SiC material, a carbon material coated with SiC, a SIC material coated with SiC, and a high melting-point metal material.

6. The semiconductor manufacturing equipment according to claim 1, further comprising:
    openings prepared in the first and the second connection parts, and the first and the second electrodes, respectively;
    a first bolt configured to fix the first connection part and the first electrode by passing through the opening in the first connection part, the first bolt having a smaller diameter than the opening in the first connection part such that a position of the first connection part relative to the first electrode is adjustable; and a second bolt configured to fix the second connection part and the second electrode by passing through the opening in the second connection part, the second bolt having a smaller diameter than the opening in the second connection part such that a position of the second connection part relative to the second electrode is adjustable.

* * * * *